United States Patent
Teng

(10) Patent No.: US 7,829,260 B2
(45) Date of Patent: *Nov. 9, 2010

(54) TREATMENT OF LASER EXPOSED LITHOGRAPHIC PRINTING PLATE BEFORE DEVELOPMENT

(76) Inventor: Gary Ganghui Teng, 10 Kendall Dr., Northborough, MA (US) 01532

( * ) Notice: Subject to any disclaimer, the term of this patent is extended or adjusted under 35 U.S.C. 154(b) by 377 days.

This patent is subject to a terminal disclaimer.

(21) Appl. No.: 11/967,961

(22) Filed: Dec. 31, 2007

(65) Prior Publication Data

US 2009/0170040 A1 Jul. 2, 2009

(51) Int. Cl.
*G03F 7/00* (2006.01)
*G03F 7/26* (2006.01)

(52) U.S. Cl. ............... 430/302; 430/309; 430/301; 101/463.1

(58) Field of Classification Search ......... 430/138, 430/270.1, 281.1, 302, 309; 101/451
See application file for complete search history.

(56) References Cited

U.S. PATENT DOCUMENTS

| | | | | |
|---|---|---|---|---|
| 5,858,604 | A * | 1/1999 | Takeda et al. | 430/162 |
| 5,922,502 | A * | 7/1999 | Damme et al. | 430/162 |
| 6,740,464 | B2 | 5/2004 | Maemoto | 430/138 |
| 6,881,532 | B2 | 4/2005 | Suzuki | 430/302 |
| 7,213,516 | B1 | 5/2007 | Teng | 101/451 |
| 7,297,467 | B2 | 11/2007 | Vander Aa | 430/302 |
| 2003/0186165 | A1 | 10/2003 | Gries et al. | 430/281.1 |
| 2006/0251993 | A1* | 11/2006 | Teng | 430/302 |
| 2007/0202443 | A1 | 8/2007 | Mitsumoto | 430/302 |
| 2007/0254241 | A1* | 11/2007 | Teng | 430/302 |
| 2007/0287098 | A1 | 12/2007 | Inno | 430/302 |
| 2007/0298350 | A1 | 12/2007 | Hayashi et al. | 430/270.1 |

* cited by examiner

*Primary Examiner*—Cynthia H Kelly
*Assistant Examiner*—Chanceity N Robinson

(57) ABSTRACT

A method of treating a laser exposed lithographic printing plate with a deactivating solution followed by overall irradiation is described. The plate comprises on a substrate a photosensitive layer capable of photo hardening. The deactivating solution is capable of deactivating the photo hardening capability of the photosensitive layer in the non-hardened areas so that the overall irradiation does not cause hardening of the photosensitive layer in the non-hardened areas. The deactivation and overall irradiation cause one or more chemical or physical changes to the photosensitive layer, such as further hardening of the imaged areas, improved contrast, improved developability, or improved substrate hydrophilicity. The overall irradiated plate is further developed on press with ink and/or fountain solution or off press with a developer. For off-press development, the developer may be used as the deactivating solution.

7 Claims, No Drawings

TREATMENT OF LASER EXPOSED LITHOGRAPHIC PRINTING PLATE BEFORE DEVELOPMENT

FIELD OF THE INVENTION

This invention relates to lithographic printing plate. More particularly, it relates to a method of treating a lithographic plate after laser imaging and before development.

BACKGROUND OF THE INVENTION

Lithographic printing plates (after process) generally consist of ink-receptive areas (image areas) and ink-repelling areas (non-image areas). During printing operation, an ink is preferentially received in the image areas, not in the non-image areas, and then transferred to the surface of a material upon which the image is to be produced. Commonly the ink is transferred to an intermediate material called printing blanket, which in turn transfers the ink to the surface of the material upon which the image is to be produced.

At the present time, lithographic printing plates (processed) are generally prepared from lithographic printing plate precursors (also commonly called lithographic printing plates) comprising a substrate and a photosensitive coating deposited on the substrate, the substrate and the photosensitive coating having opposite surface properties. The photosensitive coating is usually a photosensitive material, which solubilizes or hardens upon exposure to an actinic radiation, optionally with further post-exposure overall treatment. In positive-working systems, the exposed areas become more soluble and can be developed to reveal the underneath substrate. In negative-working systems, the exposed areas become hardened and the non-exposed areas can be developed to reveal the underneath substrate.

Conventionally, the exposed plate is developed with a liquid developer to bare the substrate in the non-hardened or solubilized areas. On-press developable lithographic printing plates have been disclosed in recent years. Such plates can be directly mounted on press after imagewise exposure to develop with ink and/or fountain solution during the initial prints and then to print out regular printed sheets. No separate development process before mounting on press is needed, allowing the reduction of labor and the elimination of hazardous waste. Among the patents describing on-press developable lithographic printing plates are U.S. Pat. Nos. 5,258,263, 5,516,620, 5,561,029, 5,616,449, 5,677,110, 5,811,220, 6,014,929, 6,071,675, and 6,482,571.

Traditionally, the plate is exposed with an ultraviolet light from a lamp through a separate photomask film having a predetermined imaging pattern that is placed between the light source and the plate. Laser sources have been increasingly used to imagewise expose a printing plate that is sensitized to a corresponding laser wavelength, allowing the elimination of the photomask film. Suitable lasers include, for example, infrared lasers (such as laser diode of about 830 nm and NdYAG laser of about 1064 nm), visible lasers (such as frequency-doubled NdYAG laser of about 532 nm and violet laser diode of about 405 nm), and ultraviolet laser (such as ultraviolet laser diode of about 370 nm). Laser sensitive plates generally have higher sensitivity (than conventional plates) because of the limited power of current laser imagers.

While laser imagable plates have the advantage of not requiring a photomask film for imaging, such plates often have the drawbacks of limited room light stability, weaker visible images upon exposure, higher sensitivity to the process condition (such as developer temperature or freshness, brush pressure, or lag time between laser imaging and development), limited photospeed for the available laser, or limited durability.

The inventor has found that a simple treatment of the laser imaged plate with a deactivating solution and overall irradiation can be used to cause certain chemical or physical change to the plate without developing the plate, so as to eliminate some of the above drawbacks or to enhance the performance of the plate (such as to improve color contrast, resolution, durability, or imaging consistence).

SUMMARY OF THE INVENTION

According to the present invention, there has been provided a method of processing a lithographic printing plate, comprising in order:
(a) providing a lithographic plate comprising (i) a substrate, and (ii) a photosensitive layer capable of hardening upon exposure to a laser having a wavelength selected from 200 to 1200 nm as well as to a conventional radiation;
(b) imagewise exposing said plate with said laser to cause hardening of said photosensitive layer in the exposed areas, so as to form hardened areas in the exposed areas and non-hardened areas in the non-exposed areas;
(c) contacting said plate with a deactivating solution to make the non-hardened areas of the photosensitive layer incapable of hardening upon exposure to said radiation, without developing said plate;
(d) overall exposing said plate with said radiation to cause at least one chemical or physical change to the photosensitive layer or the substrate, without causing hardening of said non-hardened areas of the photosensitive layer; and
(e) developing said plate to remove the non-hardened areas of said photosensitive layer.

The term "conventional radiation" (also called "radiation" in this application) means a non-laser radiation, including radiations from lamps, such as an ultraviolet light from an ultraviolet lamp, a visible light from a white light lamp, or an infrared light from an infrared lamp.

Said deactivating solution is capable of deactivating the photo hardening capability of the photosensitive layer in the imagewise non-exposed areas (also called non-imaged areas) under a radiation, so that the overall exposure with said radiation does not cause hardening in the non-imaged areas. The deactivating solution may or may not deactivate the photosensitive layer in the imagewise exposed areas (also called imaged areas). Preferably, the deactivating solution is capable of diffusing into the non-hardened areas of the photosensitive layer more efficiently than into the hardened areas of the photosensitive layer (diffusing more or only into the non-hardened areas, with less or no diffusion into the hardened areas), so that the deactivating solution selectively deactivates the non-hardened areas of the photosensitive layer. The deactivating solution is preferably an aqueous solution, with or without addition of organic solvent, comprising at least one deactivating agent which is a compound capable of deactivating the photosensitive layer at least in the non-hardened areas.

In addition to deactivation, the deactivating solution is preferably also capable of causing other chemical or physical change to the photosensitive layer or the substrate surface primarily or only in the non-hardened areas (with less or no effect in the hardened areas), such as capable of changing the color of the photosensitive layer primarily or only in the non-hardened areas (with less or no color change in the hardened areas), capable of enhancing the hydrophilicity of the substrate, capable of increasing the ease of on-press development with ink and fountain solution, or capable of causing a chemical or physical change to the photosensitive layer or the substrate for other performance enhancement.

The overall exposure with the radiation causes at least one other chemical or physical change to the photosensitive layer or the substrate surface without causing hardening of the non-imaged areas, such as further hardening in the laser imaged areas, enhanced contrast, improved hydrophilicity of the substrate (for example by producing heat to the substrate surface to accelerate reaction between the deactivating solution and the substrate), and improved developability. Preferably, the overall exposure causes further hardening of the photosensitive layer in the hardened areas. Here the term "further hardening" means becoming more durable and more resistant to press chemicals, usually through further crosslinking of the monomer or polymer.

For plate developable off press with a developer, the deactivating solution can be the developer. Preferably the developer is an aqueous developer capable of both deactivating and developing the photosensitive layer in the non-imaged areas. The imaged plate can be dipped through the developer in a developer tank for both deactivation and development, while overall exposed with the radiation at least before the plate is developed (preferably by rubbing with a brush or roller or the like while immersed in the developer).

The plate is overall exposed with the radiation after the plate is contacted with the deactivating solution, with or without drying. Preferably, the plate is covered with the deactivating solution by either immersed in the deactivating solution or wetted with the deactivating solution during the overall exposure.

The plate is preferably treated on a treating device which supplies the deactivating solution and is equipped with a light source for said overall radiation. Preferably, the radiation is from a lamp other than the room light lamp. More preferably, the radiation is an ultraviolet light from an ultraviolet lamp or an infrared light from an infrared lamp.

The laser for the imagewise exposure in this application can be any laser having a wavelength selected from 200 to 1200 nm which is capable of causing hardening to the photosensitive layer. Such laser is preferably a violet or ultraviolet laser of 200 to 430 nm (as for a violet or ultraviolet sensitive plate) or an infrared laser of 750 to 1200 nm (as for an infrared sensitive plate).

DETAILED DESCRIPTION OF THE PREFERRED EMBODIMENTS

The deactivating solution can be any solution capable of deactivating the photo hardening capability of the photosensitive layer in the non-hardened areas (with or without deactivating the photosensitive layer in the hardened areas), so that the photosensitive layer becomes incapable of photo hardening in the non-hardened areas upon exposure to a radiation (which radiation is used for the overall exposure in this invention). The deactivating solution can be based on water and/or organic solvent as the solvent. Preferably, the deactivating solution is an aqueous solution. More preferably, the deactivating solution is an aqueous solution comprising at least 50% by weight of water, most preferably at least 80% by weight of water.

In addition to the capability of deactivation, the deactivating solution can also have other capability such as discoloration (capable of changing the color of the photosensitive layer primarily or only in the non-hardened areas), hydrophilization (capable of enhancing the hydrophilicity of the substrate), or development enhancement (capable of increasing the on-press developability with ink and/or fountain solution). Certain additives may be added in the deactivating solution to achieve the desired properties.

The deactivating solution is generally a solution containing a deactivating agent that is a compound capable of deactivating the photo hardening capability of the photosensitive layer at least in the non-hardened areas. It is preferably an aqueous solution comprising at least one water-soluble deactivating agent. A water-soluble organic solvent, such as ethylene glycol, can be added into the aqueous deactivating solution. Certain additives, such as dye, dispersed pigment, bactericide, stabilizer, reducer, thickening agent, and surfactant, can be added. The concentration of the deactivating agent in a deactivating solution is from 0.01 to 70%, more preferably from 0.1 to 30%, and most preferably from 1 to 10% by weight of the solution.

The deactivating agent can be a solid, liquid, or gas; preferably a liquid or solid. Either organic or inorganic compound can be used as deactivating agent, such as organic or inorganic acid, base, oxidizer, reducer, or inhibitor. Various deactivating agents have been described in U.S. Pat. No. 7,213,516, and U.S. patent application Ser. Nos. 11/356,911, 11/728,648, 11/787,878, 11/800,634, and 11/825,576; the entire disclosures of which are hereby incorporated by reference. The deactivating agent is preferably soluble in water or an organic solvent, and more preferably soluble in water.

For free radical polymerizable photosensitive layer, the deactivating agent can be a compound that can react with a component of the free radical initiating system (such as initiator, sensitizing dye, hydrogen donor, or monomer; preferably the initiator, sensitizing dye, or hydrogen donor). For cationic polymerizable photosensitive layer, the deactivating agent can be a compound that can react with a component of the cationic polymerization system (such as the initiator which is an acid generator, sensitizing dye, or monomer; preferably the initiator or sensitizing dye).

For polymerizable photosensitive layer having an amine group or other group capable of reacting with an acid in the initiator, sensitizing dye, or hydrogen donor, an acid compound (including organic acid and inorganic acid) can be used as the deactivating agent. Suitable organic acids include, for example, organic compounds having at lease one carboxylic acid group, sulfonic acid group, or phosphonic acid group. Suitable inorganic acids include for example, phosphoric acid, boric acid, and hydrochloride acid. Preferred acids are those with moderate acidity, such as organic compounds with at least one carboxylic acid group, phosphoric acid, polyvinyl phosphonic acid, and boric acid. More preferred are water soluble organic acids. Most preferred are water-soluble organic compounds having at least one carboxylic acid group. Suitable organic acids include, for example, citric acid, acetic acid, salicylic acid, glycolic acid, malic acid, and lactic acid. Citric acid and malic acid are particularly suitable because they are widely used natural organic acids and are non-hazardous to the environment. The acid is preferably applied as an aqueous solution to deactivate the photosensitive layer. When strong acid (such as hydrochloric acid) is used as deactivating agent, it is preferably diluted to low concentration (such as less than 0.5%, preferably less than 0.1% by weight) in an aqueous solution to apply to the plate so that it does not damage the plate or cause safety problem. The acidic deactivating solution preferably has a pH of from 0.1 to 6.0, more preferably from 0.5 to 5.0, and most preferably from 1.0 to 4.0. The acidic deactivating solution preferably has a concentration of from 0.01 to 70%, and more preferably from 0.05 to 30% by weight of the solution. The aqueous acidic deactivating solution based on organic acid preferably has a concentration of from 0.1 to 70%, more preferably from 0.5 to 30%, and most preferably from 2 to 10% by weight of the solution.

An alkaline compound can also be used as the deactivating agent for certain negative plates with free radical or cationic polymerizable or other acid crosslinkable photosensitive layers because it can react with certain free radical initiating system (such as initiator, sensitizing dye, or hydrogen donor), certain cationic initiating system (such as initiator which is an acid generator, or sensitizing dye), other acid crosslinkable systems (such as negative-working diazonaphthoquinone systems), and acid functional polymeric binder (for example to neutralize with the carboxylic acid groups on an alkaline soluble polymer so as to make the polymer soluble in the aqueous deactivating solution and incompatible with other components of the photosensitive layer). For example, an alkaline compound can react with an ionic initiator such as an onium salt, an ionic sensitizing dye such as a cyanine dye, or a hydrogen donor having carboxylic acid or thiol group; and can also neutralize with a cationic initiator which is an acid generator. Suitable alkaline compounds include, for example, sodium silicate, potassium silicate, sodium carbonate, sodium hydroxide, and organic amines. Preferred alkaline compounds are water-soluble compounds with moderate basicity, such as sodium silicate, potassium silicate, ammonium hydroxide, and amines. More preferred amines are organic amines, including polymeric amines. Suitable water-soluble amines include regular amine compounds such as triethylamine, triethanolamine, 2-amino-2-methyl-1-propanol, tris(hydroxymethyl)aminomethane and N-methyl-2-pyrrolidone, and polymeric amines such as polyethyleneamine. The alkaline compound is preferably applied as an aqueous solution to deactivate the photosensitive layer. When strong base (such as sodium hydroxide) is used as deactivating agent, it is preferably diluted to low concentration (such as less than 0.5%, preferably less than 0.1% by weight) in an aqueous solution so that it does not damage the plate or cause safety problem. The alkaline deactivating solution preferably has a pH of from 8.0 to 13.5, more preferably from 9.0 to 13.0, and most preferably from 10.0 to 12.0. The alkaline deactivating solution preferably has a concentration of from 0.01 to 70%, and more preferably from 0.05 to 30% by weight of the solution. The aqueous alkaline deactivating solution based on organic amine preferably has a concentration of from 0.1 to 70%, more preferably from 0.5 to 30%, and most preferably from 2 to 10% by weight of the solution.

A free radical inhibitor can be used as the deactivating agent for plates with a free radical polymerizable photosensitive layer. Examples of suitable free radical inhibitors include methoxyhydroquinone, hydroquinone, 2,6-di-tert-butyl-4-methylphenol, polyvinylphenol, other compounds with at least one phenol group, and various commercial free radical stabilizer. Preferably, the inhibitor is dissolved in water or a water-solvent mixture (containing water and a water soluble organic solvent) to form an aqueous deactivating solution for applying to the plate. The deactivating solution based on a free radical inhibitor preferably has a concentration of from 0.1 to 70%, more preferably from 0.5 to 30%, and most preferably from 2 to 10% by weight of the solution.

A deactivating agent may also act as a discoloring agent for certain system. For example, certain acid or base (such as citric acid or sodium silicate) can acts as both a deactivating agent and discoloring agent for certain free radical polymerizable photosensitive layer having crystal violet as colorant. Here, the discoloring agent can be any material that is capable of changing the color of the photosensitive layer primarily or only in the non-hardened areas, with less or no color change in the hardened areas. Preferably, the discoloring agent is a material that is capable of reacting with a dye or latent dye in the photosensitive layer to cause color change (including turning on or turning off of color). The deactivating solution capable of discoloration can comprise the same compound capable of both deactivation and discoloration. or comprise different compounds with at least one capable of deactivation and at least one capable of discoloration.

Likewise, a deactivating agent may also act as a hydrophilization agent for certain system. For example, an acid or base (such as phosphoric acid, sodium silicate, or potassium hydroxide), which can be used as deactivating agent for certain photosensitive layer, may also increase the hydrophilicity of an aluminum substrate. Here, the hydrophilizing agent can be any compound capable of enhancing the hydrophilicity of the substrate. Preferably, the hydrophilizing agent is an acid or base. The deactivating solution capable of hydrophilization can comprise the same compound capable of both deactivation and hydrophilization, or comprise different compounds with at least one capable of deactivation and at least one capable of hydrophilization.

Furthermore, a deactivating agent may also act as a development enhancer for certain system. For example, for a free radical polymerizable photosensitive layer comprising an alkaline soluble polymeric binder, an alkaline compound (such as sodium silicate) can act as both deactivating agent and development enhancer. Here, the development enhancer can be any compound capable of enhancing the developability of the photosensitive layer. Examples of developer enhancer include liquid organic compounds capable softening the photosensitive layer, and alkaline compounds capable of neutralizing the polymeric binder in the photosensitive layer, to make the photosensitive layer more soluble or dispersible in ink and/or fountain solution. The deactivating solution capable of development enhancement can comprise the same compound capable of both deactivation and development enhancement, or comprise different compounds with at least one capable of deactivation and at least one capable of development enhancement.

Preferably, the deactivating solution is capable of enhancing at least one other performance characteristic of the plate (in addition to deactivation), such as enhancing visible image contrast or substrate hydrophilicity. More preferably, the deactivating solution is also capable of enhancing the image contrast of the laser imaged plate (by discoloration primarily or only in the non-hardened areas), hydrophilicity of the substrate, and developability of the photosensitive layer. The deactivating solution capable of two or more functions (such as both deactivation and discoloration) can comprise 2 separate components (such as a deactivating agent and a discoloring agent), can comprise the same component capable of at least two functions (such as a deactivating agent which is also a discoloring agent), or can comprise both a component with two or more functions and a component with only single function. Preferably, the deactivating solution comprises at least one component which is capable of two or more functions (such as both deactivating the photosensitive layer and hydrophilizing the substrate). Examples of multifunctional deactivating agents include alkaline compounds (such as sodium silicate) which are capable of deactivation, discoloration, and hydrophilization for certain plates.

The deactivating solution can be applied to the photosensitive layer of the plate through any means, such as spray, dipping, roller coating, slot coating, etc. The deactivating solution can be at room temperature or an elevated temperature, preferably room temperature.

The deactivated plate is further overall exposed with a radiation to cause at least one chemical or physical change to the photosensitive layer or substrate, without causing hardening of the non-imaged areas of the photosensitive layer. Preferably, such overall irradiation causes further hardening of the photosensitive layer in the imaged areas, enhances color contrast of the photosensitive layer, or improves the hydrophilicity of the substrate in the non-imaged areas. More preferably, such overall irradiation causes further hardening of the photosensitive layer in the imaged areas and enhances color contrast of the photosensitive layer.

The radiation for the overall exposure can be applied with any exposure method which delivers radiation to the whole photosensitive layer; preferably from a lamp on an exposure device, on a treating device (by passing through it), or under room light; more preferably on an exposure device or by passing through a radiation from a lamp on a treating device; most preferably by passing through a radiation from a lamp on a treating device.

The deactivated plate may be further dried to remove at least some of the water or solvent from the deactivating solution after or before the overall exposure with a radiation, preferably after overall exposure. The plate is preferably dried in a way so that the plate surface is at least free of overflowing liquid, and more preferably at least free of wet-looking liquid layer. The plate can be dried by any means, such as squeegee rollers, forced air, heat, or rubber blade. Preferably, the treated plate is dried with squeegee rollers, forced hot air, or squeegee rollers followed by forced air. More preferably, the treated plate is dried by a pair of squeegee rollers followed by forced hot air.

The deactivation and overall exposure are preferably performed on a treating device which contains a deactivating solution and a radiation source and is capable of contacting the deactivating solution to the plate and overall exposing the deactivated plate with the radiation. Preferably, the plate is transported through the treating device to contact with the deactivating solution and overall exposed with the radiation. The deactivating solution can be applied to the plate through any means equipped on the treating device, preferably by spraying, dipping through the deactivating solution in a tank, slot coating, or roller coating (to coat a thin layer of the deactivating solution onto the plate). The radiation can be from any light source installed on the treating device, preferably an ultraviolet lamp or infrared lamp. More preferably, the plate is dipped through the deactivating solution in a tank and then applied with the radiation. The plate is preferably blocked from the radiation before contacted with the deactivating solution when transporting through the treating device. The treating device preferably further comprises a drying unit (such as a pair of squeegee rollers, forced air, heater, or a pair of squeegee rollers followed by forced hot air) to dry off the liquid on the plate surface, preferably after deactivation and overall exposure. The treating device can be a separate device from the exposure device, or can be connected to or be part of the exposure device. Preferably, the treating device is connected to or is part of the exposure device.

For conventional plate (which is developed off press with a developer), the deactivating solution is preferably the developer. So the deactivating solution is capable of both deactivating and developing the photosensitive layer in the non-imaged areas. In this application, the term developing means removing the non-hardened areas of the photosensitive layer from the plate. Useful deactivating solutions capable of developing the plate include certain alkaline aqueous developers. It is preferred that the development of the photosensitive layer by the deactivating solution requires a rubbing action with brush, cloth roller, or the like. The plate can be contacted with the deactivating solution and overall exposed with the radiation, and then rubbed to develop the photosensitive layer. Preferably, the plate can pass through a deactivating solution in a tank having a brush, cloth roller or the like in the tank close to the center or later part of the passage, while overall exposed with the radiation during at least the earlier part of the passage, wherein the plate is developed after rubbed in the deactivating solution. The developed plate can be further rinsed with water or an aqueous solution. A plate finisher, such as gum Arabic, can be applied to the plate to further enhance the hydrophilicity of the bared substrate. The treated, rinsed or finished plate can be further dried with forced air and/or heat, preferably with forced hot air.

For conventional plates, some developers can be directly used as the deactivating solution, while other developers require the addition of a deactivating agent to become a deactivating solution. For example, various alkaline aqueous developers can be directly used as the deactivating solutions, and various developers with substantially neutral pH require the addition of a deactivating agent to form deactivating solutions which are also developers. Preferred are aqueous developers, which include alkaline aqueous developers and non-alkaline aqueous developers.

The alkaline aqueous developer of this application is an aqueous solution comprising 60-99% by weight of water, and 0.02 to 30%, preferably 0.1 to 20% and more preferably 0.5 to 100%, by weight of alkaline compound and having a pH of at least 9.0, preferably from 10.0 to 13.5, and more preferably from 11.0 to 13.0. More than one alkaline compound can be used. Suitable alkaline compounds include inorganic alkaline compounds such as potassium silicate, sodium silicate, potassium hydroxide, and sodium hydroxide, and organic amine compounds such as triethylamine, diethylamine, triethanolamine, and diethanolamine. One or more surfactants (ionic or nonionic or both) are preferably added. Examples of useful surfactants include polyethylene glycol, polypropylene glycol, and copolymer of ethylene glycol and propylene glycol, polysiloxane surfactants, ionic perfluorocarbon surfactants, nonionic perfluorocarbon surfactants, sodium dioctylsulfosuccinate, sodium dodecylbenzenesulfonate, sodium butylnaphthalenesulfate, sodium alkylnaphthalenesulfate, sodium cumenesulfonate, and ammonium laurylsulfate. The surfactant is preferably added at from 0.01 to 20% by weight of the developer, more preferably from 0.1 to 10%, and most preferably from 1 to 5%. Various other additives, such as defoamer, bactericide, dye or pigment, and substrate conditioner (such as gum Arabic and maltodextrin), can be added. One or more organic solvents, preferably water soluble organic solvents, can be added at 0.1 to 20% by weight of the developer. Preferably, no organic solvent is added. Alkaline aqueous developer usually can be directly used as the deactivating solution.

The non-alkaline aqueous developer (as defined in this application) comprises 60-99% by weight of water and has a pH of from 1.0 to 8.0, preferably 2.0 to 7.5, and more preferably 3.0 to 7.0. A surfactant is preferably added. An alcohol solvent is also preferably added. The alcohol solvent is defined as a water-soluble liquid organic compound having at least one hydroxyl group. The alcohol solvent must be soluble in water at the added concentration. Liquid alkyl alcohol (including arylalky alcohol) and its liquid derivatives are preferred alcohol solvents. Alcohol solvents useful for the developer of this invention include, for example, various liquid water-soluble alkyl alcohol, arylalkyl alcohol, alkoxyalkyl alcohol, arylalkoxyalkyl alcohol, aroxyalkyl alcohol, oxydialkanol, and alkyl lactate. Other functional group, such as ester, ether, epoxy, or ethylenic group, may be attached to the alkyl or aryl group. Examples of useful alcohol solvents are benzyl alcohol, phenethyl alcohol, isopropyl alcohol, 1-propyl alcohol, ethyl alcohol, butyl alcohol, ethyl lactate, propyl lactate, butyl lactate, methoxyethanol, ethoxyethanol, propoxyethanol, butoxyethanol, methoxypropanol, ethoxypropanol, propoxypropanol, butoxypropanol, diethylene glycol (2,2'-oxydiethanol), phenoxyethanol, and phenoxypropanol. For the alcohols with isomers, all liquid isomers can be used. Benzyl alcohol is a particularly useful alcohol solvent. Usually one alcohol solvent is used in the developer. However, two or more alcohol solvents can also be used in the same developer. The alcohol solvent is added preferably at 0.1 to 40% by weight of the developer, more preferably at 1 to 20% by weight of the developer, and most preferably at 2 to 10%. The surfactant useful for the non-alkaline developer of this invention can be ionic surfactant, nonionic surfactant or both. Examples of useful surfactants include polyethylene glycol, polypropylene glycol, and copolymer of ethylene glycol and propylene glycol, polysiloxane surfactants, ionic perfluorocarbon surfactants, nonionic perfluorocarbon surfactants, sodium dioctylsulfosuccinate, sodium dodecylbenzenesulfonate, sodium butylnaphthalenesulfate, sodium alkylnaphthalenesulfate, sodium cumenesulfonate, and ammonium laurylsulfate. The surfactant is preferably added at from 0.1 to 20% by weight of the developer, more preferably from 0.5 to 10%, and most preferably from 1 to 5%. Various other additives, such as defoamer, bactericide, dye or pigment, and substrate conditioner (such as gum arabic, and maltodextrin), can be added. Certain acid, such phosphoric acid or citric acid can be added to improve the hydrophilicity of the substrate. Certain salts, such as sodium chloride, monosodium phosphate, trisodium phosphate, potassium phosphate and ammonium sulfite, may be added to, for example, improve the hydrophilicity of the bared substrate. A deactivating agent can be added to make the non-alkaline aqueous developer capable of deactivation. Some non-alkaline aqueous developers, such as certain developers with high acidity (such as with pH of lower than 2). may also be deactivating solutions, without the addition of any other deactivating agent.

For plate with an overcoat, the deactivating solution can be applied with or without the overcoat being removed first (such as by rinsing with water or an aqueous solution). When the overcoat is not removed before applying the deactivating solution, the deactivating solution may penetrate through the overcoat without removing the overcoat, or partially or completely remove the overcoat.

Before the deactivation and overall exposure, the laser imaged plate may be heated to further harden the photosensitive layer in the imaged areas. The heating condition is preferably 50 to 200° C. for 1 to 600 seconds, more preferably 70 to 140° C. for 1 to 300 seconds, and most preferably 90 to 120° C. for 1 to 60 seconds. The heating can be applied through any means, such as hot plate, oven, passing-through heater, radiation heater, and hot air heater. Preferably, the plate is passed through a heater having radiation or hot air. More preferably, the plate is passed through a heater which is part of or connected to a treating device.

Infrared lasers useful for the imagewise exposure of the thermosensitive plates of this invention include laser sources emitting in the near infrared region, i.e. emitting in the wavelength range of from 750 to 1200 nm, and preferably from 800 to 1100 nm. Particularly preferred infrared laser sources are laser diodes emitting around 830 nm or a NdYAG laser emitting around 1060 nm. The plate is exposed at a laser dosage that is sufficient to cause hardening in the exposed areas but not high enough to cause substantial thermal ablation. The exposure dosage is preferably from 1 to 500 mJ/cm$^2$, more preferably from 5 to 200 mJ/cm$^2$, and most preferably from 20 to 150 mJ/cm$^2$, depending on the sensitivity of the thermosensitive layer.

Visible lasers useful for the imagewise exposure of the visible light sensitive plates of this invention include any laser emitting in the wavelength range of from 390 to 600 nm. Examples of suitable visible lasers include frequency-doubled Nd/YAG laser (about 532 nm), argon ion laser (about 488 nm), violet diode laser (about 405 nm), and visible LEDs. Violet laser diode is especially useful because of its small size and relatively low cost. The exposure dosage is preferably from 0.0001 to 5 mJ/cm$^2$ (0.1 to 5000 µJ/cm$^2$), more preferably from 0.001 to 0.5 mJ/cm$^2$ (1 to about 500 µJ/cm$^2$), and most preferably from 0.005 to 0.10 mJ/cm$^2$ (5 to 100 µJ/cm$^2$), depending on the sensitivity of the photosensitive layer.

Ultraviolet lasers useful for the imagewise exposure of the ultraviolet light sensitive plates of this invention include any laser having a wavelength of from 200 to 390 nm. Examples of ultraviolet lasers include ultraviolet diode lasers or LEDs having a wavelength of from 350 to 390 nm. Laser diodes are preferred ultraviolet lasers. The exposure dosage is preferably from 0.0001 to 5 mJ/cm$^2$ (0.1 to 5000 µJ/cm$^2$), more preferably from 0.001 to 0.5 mJ/cm$^2$ (1 to about 500 µJ/cm$^2$), and most preferably from 0.005 to 0.10 mJ/cm$^2$ (5 to 100 µJ/cm$^2$), depending on the sensitivity of the photosensitive layer.

Among the visible and ultraviolet lasers, violet or ultraviolet laser with a wavelength selected from 200 to 430 nm, preferably from 300 to 430 nm, is particularly useful.

Laser imaging devices are currently widely available commercially. Any device can be used which provides imagewise laser exposure according to digital imaging information. Commonly used imaging devices include flatbed imager, internal drum imager, and external drum imager, all of which can be used for the imagewise laser exposure in this invention.

For on-press developable plate, the plate can be exposed on a laser imager, treated with a deactivating solution and overall exposed with a radiation (preferably on a treating device, which can be standalone or can be connected to or part of the laser imager, preferably connected to or part of the laser imager), and then mounted on press to develop with ink and/or fountain solution and then print out regular printed sheets. The ink and/or fountain solution solubilized or dispersed photosensitive layer can be mixed into the ink and/or the fountain solution on the rollers, and/or can be transferred to the blanket and then the receiving medium (such as paper). The fountain solution roller is engaged (to the plate cylinder as for conventional inking system or to the ink roller as for integrated inking system) for preferably 0 to 100 rotations, more preferably 1 to 50 rotations and most preferably 5 to 20 rotations (of the plate cylinder), and the ink roller is then engaged to the plate cylinder for preferably 0 to 100 rotations, more preferably 1 to 50 rotations and most preferably 5 to 20 rotations before engaging the plate cylinder and feeding the receiving medium. Good quality prints should be obtained preferably under 40 initial impressions (of printed sheets), more preferably under 20 impressions, and most preferably under 5 impressions.

For conventional wet press, usually fountain solution is applied (to contact the plate) first, followed by contacting with ink roller. For press with integrated inking/dampening system, the ink and fountain solution are emulsified by various press rollers before being transferred to the plate as emulsion of ink and fountain solution. However, in this invention, the ink and fountain solution may be applied at any combination or sequence, as needed for the plate. There is no particular limitation.

The ink used in this application can be any ink suitable for lithographic printing. Most commonly used lithographic inks include "oil based ink" which crosslinks upon exposure to the oxygen in the air and "rubber based ink" which does not crosslink upon exposure to the air. Specialty inks include, for example, radiation-curable ink and thermally curable ink. An ink is an oleophilic, liquid or viscous material which generally comprises a pigment dispersed in a vehicle, such as vegetable oils, animal oils, mineral oils, and synthetic resins. Various additives, such as plasticizer, surfactant, drier, drying retarder, crosslinker, and solvent may be added to achieve certain desired performance. The compositions of typical lithographic inks are described in "The Manual of Lithography" by Vicary, Charles Scribner's Sons, New York, and Chapter 8 of "The Radiation Curing Science and Technology" by Pappas, Plenum Press, New York, 1992.

The fountain solution used in this application can be any fountain solution used in lithographic printing. Fountain solution is used in wet lithographic printing press to dampen the hydrophilic areas (non-image areas), repelling ink (which is hydrophobic) from these areas. Fountain solution contains mainly water, generally with addition of certain additives such as gum arabic and surfactant. Small amount of alcohol such as isopropanol can also be added in the fountain solution. Water is the simplest type of fountain solution. Fountain solution is usually neutral to mildly acidic. However, for certain plates, mildly basic fountain solution is used. The type of fountain solution used depends on the type of the plate substrate as well as the photosensitive layer. Various fountain solution compositions are described in U.S. Pat. Nos. 4,030,417 and 4,764,213.

Emulsion of ink and fountain solution is an emulsion formed from ink and fountain solution during wet lithographic printing process. Because fountain solution (containing primarily water) and ink are not miscible, they do not form stable emulsion. However, emulsion of ink and fountain solution can form during shearing, compressing, and decompressing actions by the rollers and cylinders, especially the ink rollers and plate cylinder, on a wet lithographic press. For wet press with integrated inking system, ink and fountain solution are emulsified on the ink rollers before transferred to the plate.

The laser imaging and handling of the plate before contacted with the deactivating solution can be performed with the plate under any lightings (including darkness) at least for certain amount of time, as long as the exposure to such lightings for such amount of time will not cause hardening of the photosensitive layer; such lighting can be a yellow or red light (for preferably limited time, more preferably less than 120 minutes, and most preferably less than 30 minutes), darkness or substantial darkness, or white light (for preferably limited time, more preferably less than 60 minutes. and most preferably less than 10 minutes). Preferably, the laser imaging and handling before contacted with the deactivating solution are performed with the plate under lightings (including darkness) that will not cause hardening of the photosensitive layer (even after long exposure); more preferably, under lightings containing no or substantially no radiation below a wavelength selected from 400 to 650 nm (such as 500 nm), or in darkness or substantial darkness; and most preferably under lightings containing no radiation below a wavelength selected from 400 to 650 nm, or in darkness. The lighting containing no or substantially no radiation below a wavelength selected from 400 to 650 nm (such as 500 nm) is usually a yellow or red light. This includes a light that is from a fluorescent or incandescent lamp covered with a filter that cuts off all or substantially all (at least 99%) of the radiation below a wavelength selected from 400 to 650 nm; preferably the lamp is covered with a filter that cuts off all of the radiation below a wavelength selected from 400 to 650 nm. The plate can be under the same or different lightings.

The plate can be imaged on a laser imager and then treated on a treating device having a deactivating solution and a radiation source. The plate can be manually or automatically handled between the imager and treating device. The imager and treating device may stay open to the room light which is a white light or a yellow or red light, preferably a yellow or red light, depending on the sensitivity of the plate. For plate sensitive to a room light, the exposure time to such room light should be limited (to preferably less than 120 minutes and more preferably less than 20 minutes).

For a plate with photosensitive layer which is sensitive to a room light (such as causing hardening after exposure to a yellow light for 60 minutes or to a white light for 10 minutes), the plate can be imaged on a laser imager, and treated on a treating device, preferably in a room which has a lighting that contains no or substantially no radiation below a wavelength selected from 400 to 650 nm; the plate can be manually or automatically handled between the imager and treating device; the imager and treating device can stay open to the room light. Alternatively, the plate can be packaged in a substantially light-tight cassette to feed to the imager that is designed to be substantially light-tight for the plate, with the plate covered with substantially light-tight covers; the plate can be automatically transferred to the treating device, with the plate staying within the substantially light-tight covers all or substantially all the time until it has been deactivated during the treatment; the room lighting can be a white light. Further alternatively, the above automatic processes can be designed so that the substantially light-tight covers have some light-filtering windows which are only transparent to radiation above a wavelength selected from 400 to 650 nm (such as 500 nm), so that the operator can visually monitor the plate during imaging and/or treatment.

The substrate employed in the lithographic plates of this invention can be any lithographic support. Such a substrate may be a metal sheet, a polymer film, or a coated paper. Aluminum (including aluminum alloy) sheet is a preferred metal support. Particularly preferred is an aluminum support that has been grained and anodized (with or without deposition of a barrier layer). Polyester film is a preferred polymeric film support. A surface coating may be coated to achieve desired surface properties. For wet plate, the substrate should have a hydrophilic or oleophilic surface, depending on the surface properties of the photosensitive layer (preferably with opposite philicity to the substrate); more preferably, a wet lithographic plate has a hydrophilic substrate and an oleophilic photosensitive layer. For waterless plate, the substrate should have an oleophilic or oleophobic surface, depending on the surface properties of the photosensitive layer (preferably with opposite philicity to the substrate).

Particularly suitable hydrophilic substrate for a wet lithographic plate is an aluminum support that has been grained and anodized; such a substrate is preferably further deposited with a hydrophilic barrier layer. Surface graining can be achieved by mechanical graining or brushing, chemical etching, and/or AC electrochemical graining. The roughened surface can be further anodized to form a durable aluminum oxide surface using an acid electrolyte such as sulfuric acid and/or phosphoric acid. The roughened and anodized aluminum surface can be further thermally or electrochemically coated with a layer of silicate or hydrophilic polymer such as polyvinyl phosphonic acid, polyacrylamide, polyacrylic acid, polybasic organic acid, copolymers of vinyl phosphonic acid and acrylamide to form a durable hydrophilic layer. Polyvinyl phosphonic acid and its copolymers are preferred polymers. Processes for coating a hydrophilic barrier layer on aluminum in lithographic plate application are well known in the art, and examples can be found in U.S. Pat. Nos. 2,714,066, 4,153, 461, 4,399,021, and 5,368,974. Suitable polymer film supports for a wet lithographic plate include a polymer film coated with a hydrophilic layer, preferably a hydrophilic layer that is crosslinked, as described in U.S. Pat. No. 5,922,502.

For the plate of this application, at least the hardened areas of the photosensitive layer exhibit an affinity or aversion substantially opposite to the affinity or aversion of the substrate to at least one printing liquid selected from the group consisting of ink and an abhesive fluid for ink (including both plates with non-phase-switchable photosensitive layer and plates with phase-switchable photosensitive layer). Preferably, the photosensitive layer exhibits an affinity or aversion substantially opposite to the affinity or aversion of the substrate to at least one printing liquid selected from the group consisting of ink and an abhesive fluid for ink (as for plates with non-phase-switchable photosensitive layer, which can be wet plate or waterless plate). More preferably, the plate has a hydrophilic substrate and an oleophilic photosensitive layer (as for wet plate with non-phase-switchable photosensitive layer). An abhesive fluid for ink is a fluid that repels ink. Fountain solution is the most commonly used abhesive fluid for ink. A wet plate is printed on a wet press equipped with both ink and fountain solution, while a waterless plate is printed on a waterless press equipped with ink.

Usually, as for most printing plates described in the literature, the photosensitive layer exhibits an affinity or aversion substantially opposite to the affinity or aversion of the substrate to at least one printing liquid selected from the group consisting of ink and an abhesive fluid for ink, and does not switch its affinity or aversion upon laser exposure. However, certain photosensitive layer exhibits substantially the same affinity or aversion as the substrate and is capable of switching to opposite affinity or aversion upon exposure to a laser (with or without further treatment such as on-press development with ink and/or fountain solution), as described in U.S. Pat. Nos. 6,331,375, 5,910,395, 6,720,464, and 6,136,503. Both non-phase-switchable photosensitive layer and phase-switchable photosensitive layer can be used for the current invention. Preferred is a non-phase-switchable photosensitive layer (coated on a substrate with opposite affinity or aversion). More preferred is an oleophilic photosensitive layer (coated on a hydrophilic substrate).

In this patent, the term color change or the term discoloration means any change on the appearance of the color, such as changing to a different color (such as from blue to green), increasing in color strength (such as becoming bluer), decreasing in color strength (such as becoming less blue), turning off of a color (such as with a blue color completely disappearing), or formation (turning on) of a color (such as from colorless to blue). The term yellow or red light means yellow light, red light, or any light with a color between yellow and red such as orange light. The term safe light means a light with a certain wavelength range being cut off, including yellow light or red light, so that it does not cause hardening of a certain photosensitive layer. The term white light means a white fluorescent light, a white incandescent light, sunlight, or any white office light. The term substantially no radiation below a wavelength means the intensity of the radiation below that wavelength is less than 1% of that for a regular 100-watt incandescent light (for home use, not focused) at a distance of 2 meters. The term substantial darkness means the intensity of the radiation is less than 1% of that for a regular 100-watt incandescent light at a distance of 2 meters. The term substantially light-tight means less than 1% of the room light can pass through. The term substantially all means at least 99%. The term "with the plate under a room light" means the plate is exposed to such room light; i.e., such room light reaches the plate. The term monomer includes both polymerizable monomer and polymerizable oligomer. The term (meth)acrylate includes acrylate and/or methacrylate (acrylate, methacrylate, or both acrylate and methacrylate).

For preparing lithographic printing plates of the current invention, any photosensitive layer is suitable which is capable of hardening upon exposure to a laser having a wavelength selected from 200 to 1200 nm, and is removable with ink and/or fountain solution (for on-press developable plate) or with a liquid developer (for off-press developable plate). Here hardening means becoming non-removable with ink and/or fountain solution or with a liquid developer. Hardening is preferably achieved through crosslinking or polymerization of the resins (polymers or monomers). A laser sensitive dye or pigment (preferably a sensitizing dye) is preferably added in the photosensitive layer. The photosensitive layer preferably has a coverage of from 100 to 4000 mg/m$^2$, and more preferably from 400 to 2000 mg/m$^2$.

A preferred photosensitive layer of this invention comprises a polymeric binder, a free radical polymerizable monomer, a free radical initiator, and a sensitizing dye. Other additives such as surfactant, dye or pigment, exposure indicator, and free radical stabilizer may be added. The weight ratio of all the monomers to all the polymeric binders is preferably at least 1.0, more preferably at least 1.5, and most preferably at least 2.0.

Photosensitive materials useful in wet plates of this invention include, for example, photosensitive compositions comprising a polymerizable monomer, an initiator. a sensitizing dye, and optionally a polymeric binder.

Photosensitive oleophobic materials useful in waterless plates of this invention include, for example, compositions comprising a monomer having perfluoroalkyl or polysiloxane groups and crosslinkable terminal groups, an initiator, and a sensitizing dye.

Infrared laser sensitive (also called thermosensitive) materials useful for wet lithographic plates of this invention include, for example, thermosensitive compositions comprising a polymerizable monomer, an initiator, an infrared absorbing dye, and optionally a polymeric binder.

Visible or ultraviolet light sensitive materials useful for wet plates of this invention include, for example, photosensitive compositions comprising a polymerizable monomer, an initiator, a visible or ultraviolet light sensitizing dye, and optionally a polymeric binder. A hydrogen donor is preferably added to accelerate the polymerization.

Polymeric binder for the photosensitive layer of this invention can be any solid film-forming polymer. Such polymer may or may not have (meth)acrylate groups or other ethylenic groups (such as allyl groups). Examples of suitable polymeric binders include (meth)acrylic polymers and copolymers (such as polybutylmethacrylate, polyethylmethacrylate. polymethylmethacrylate, polymethylacrylate, butylmethacrylate/methylmethacrylate copolymer, methylmethacrylate/methylmethacrylic acid copolymer, polyallylmethacrylate, and allylmethacrylate/methacrylic acid copolymer), polyvinyl acetate, polyvinyl butyrate, polyvinyl chloride, styrene/acrylonitrile copolymer, styrene/maleic anhydride copolymer and its partial ester, nitrocellulose, cellulose acetate butyrate, cellulose acetate propionate, vinyl chloride/vinyl acetate copolymer, butadiene/acrylonitrile copolymer, polyurethane binder, and polymeric binder having polymer backbone with recurring units having pendant poly(alkylene glycol) side chains. The polymeric binder suitable for the photosensitive layer of this invention has a weight average molecular weight of at least 5,000, preferably from 10,000 to 1,000,000, more preferably from 20,000 to 500,000 and most preferably from 50,000 to 200,000 Dalton. It is noted that polymeric compounds with weight average molecular weight of less that 5,000 can also be added in the photosensitive layer of this invention; however, in order to avoid confusion, such compounds are not considered as polymeric binder and are called oligomer (without or with polymerizable groups) in this application (oligomers having polymerizable groups are also included in the definition of monomers in this application).

Suitable free-radical polymerizable monomers include any monomer or oligomer with at least one ethylenically unsaturated group. Such monomers include monofunctional, difunctional, and multifunctional (meth)acrylate monomers or oligomers, such as (meth)acrylate esters of ethylene glycol, trimethylolpropane, pentaerythritol. ethoxylated ethylene glycol and ethoxylated trimethylolpropane; multifunctional urethanated (meth)acrylate; epoxylated (meth) acrylate; and oligomeric amine (meth)acrylates. The monomers can be urethane (meth)acrylate, or non-urethane (meth)acrylate. Combination of both urethane (meth)acrylate and non-urethane (meth)acrylate monomers can be used. The monomers preferably has at least 3 (meth)acrylate groups. more preferably at least 4 (meth)acrylate groups, even more preferably at least 5 (meth)acrylate groups, and most preferably at least 6 (meth)acrylate groups. However, monofunctional or difunctional (meth)acrylate monomer can be added into the photosensitive layer having multifunctional (meth) acrylate monomers; the total amount of such monofunctional or difunctional monomers is preferably less than 50% by weight of the total monomers, more preferably less than 30%, and most preferably less than 10%. Acrylate monomer is preferred over methacrylate monomer because of the faster photospeed of acrylate group over methacrylate group. The monomer has a molecular weight of less than 5,000, preferably from 100 to 3,000, more preferably from 200 to 2,000, and most preferably from 300 to 1,500 Dalton.

Urethane (meth)acrylate monomers include any compounds having at least one urethane linkage (—NHCOO—) and at least one (meth)acrylate group. Preferred urethane (metha)acrylate monomers are those with at least 3 (meth) acrylate groups, more preferably at least 4 (meth)acrylate groups, even more preferably at least 5 (meth)acrylate groups, and most preferably at least 6 (meth)acrylate groups. Urethane (meth)acrylate monomer is usually formed by reacting a compound having at least one isocyanate group with a (meth)acrylate compound having a hydroxy group. Urethane monomer with 2 or more (meth)acrylate groups are usually formed from a compound having one or more isocyanate groups and a (meth)acrylate compound having a hydroxy group and one or more (meth)acrylate groups. For example, a tetrafunctional urethane (meth)acrylate monomer can be formed from a compound having one hydroxy group and 2 (meth)acrylate groups with a bifunctional isocyanate compound. Suitable isocyanate compounds include, for example, aromatic diisocyanate such as p-phenylene diisocyanate, 2,4-tolylene diisocyanate, 2,6-tolylene diisocyanate, 4,4'-diphenylmethane diisocyanate, naphthalene-1,5-diisocyanate and tolydine diisocyanate; aliphatic diisocyanate such as hexamethylene diisocyanate, lysinemethyl ester diisocyanate, 2,4,4-trimethylhexamethylene diisocyanate and dimer acid diisocyanate; alicyclic diisocyanate such as isophorone diisocyanate, and 4,4'-methylenebis(cyclohexyl-isocyanate); aliphatic diisocyanate having an aromatic ring, such as xylylene diisocyanate; triisocyanate such as lysine ester triisocyanate, 1,6,11-undecane triisocyanate, 1,8-diisocyanate-4-isocyanatemethyloctane, 1,3,6-hexamethylene triisocyanate, bicycloheptane triisocyanate, tris(isocyanate phenylmethane) and tris(isocyanatephenyl)thiophosphate; and polyisocyanate formed from condensation of three or more diisocyanate compounds such as 2,4-tolylene diisocyanate isocyanurate trimer, 2,4-tolylene diisocyanate-trimethylolpropane adduct, 1,6-hexanediisocyante isocyanurate trimer. Suitable (meth)acrylate compounds with one hydroxy group include pentaerythritol tri(meth)acylate, dipentaerythritol penta(meth)acrylate, ditrimethylolpropane tri(meth) acrylate and pentaerythritol di(meth)acrylate monostearate. Various urethane (meth)acrylate monomers are described in U.S. Pat. No. 6,232,038 and U.S. Pat. Pub. No. 2002/0018962, and can be used as the urethane (meth)acrylate monomers of this instant invention. Among the urethane (meth)acrylate monomers, urethane acrylate monomer is preferred. Either aromatic urethane (meth)acrylate monomer (which contains at least one aromatic group in the molecule) or aliphatic urethane (meth)acrylate monomer (which does not contain any aromatic group in the molecule) or both can be used in a photosensitive layer of this invention.

Suitable non-urethane (meth)acrylate monomers can be any (meth)acrylate monomers without urethane linkage (—NHCOO—) in the molecule. Suitable non-urethane (meth)acrylate monomers include, for example, trimethylolpropane triacrylate, pentaerythritol tetra(meth)acrylate, dipentaerythritol penta(meth)acrylate, dipentaerythritol hexa(meth)acrylate, di(trimethylolpropane) tetra(meth)acrylate. Among the non-urethane (meth)acrylate monomers, non-urethane acrylate monomer is preferred.

Suitable free-radical initiators include, for example, the derivatives of acetophenone (such as 2,2-dimethoxy-2-phenylacetophenone, and 2-methyl-1-[4-(methylthio)phenyl]-2-morpholino propan-1-one), onium salts such as diaryliodonium hexafluoroantimonate, diaryliodonium hexafluorophosphate, diaryliodonium triflate, (4-(2-hydroxytetradecyl-oxy)phenyl)phenyliodonium hexafluoroantimonate, (4-octoxyphenyl)phenyliodonium hexafluoroantimonate bis(4-t-butylphenyl)iodonium hexafluorophosphate, triarylsulfonium hexafluorophosphate, triarylsulfonium p-toluenesulfonate, (3-phenylpropan-2-onyl) triaryl phosphonium hexafluoroantimonate and N-ethoxy(2-methyl)pyridinium hexafluorophosphate, and the onium salts as described in U.S. Pat. Nos. 5,955,238, 6,037,098 and 5,629,354; borate salts such as tetrabutylammonium triphenyl(n-butyl)borate, tetraethylammonium tri phenyl(n-butyl)borate, diphenyliodonium tetraphenylborate, and triphenylsulfonium triphenyl(n-butyl)borate, and the borate salts as described in U.S. Pat. Nos. 6,232,038 and 6,218,076; haloalkyl substituted s-triazines such as 2,4-bis(trichloromethyl)-6-(p-methoxy-styryl)-s-triazine, 2,4-bis(trichloromethyl)-6-(4-methoxy-naphth-1-yl)-s-triazine, 2,4-bis(trichloromethyl)-6-piperonyl-s-triazine, and 2,4-bis (trichloromethyl)-6-[(4-ethoxyethylenoxy)-phen-1-yl]-s-triazine, and the s-triazines as described in U.S. Pat. Nos. 5,955,238, 6,037,098, 6,010,824, and 5,629,354; titanocene compounds such as bis$\eta^9$-2,4-cyclopentadien-1-yl)bis[2,6-difluoro-3-(1H-pyrrol-1-yl)phenyl)titanium; hexaarylbiimidazole compounds such as 2,2'-bis(2-chlorophenyl)-4,4',5,5'-tetraphenyl-1,1'-biimidazole, 2,2'-bis(2-ethoxyphenyl)-4,4',5,5'-tetraphenyl-1,1'-biimidazole, 2-(1-naphthyl)-4,5- diphenyl-1,2'-biimidazole; and derivatives of acetophenone such as 2,2-dimethoxy-2-phenylacetophenone, and 2-methyl-1-[4-(methylthio)phenyl]-2-morpholino propan-1-one. Triarylsulfonium salts, diaryliodonium salts, and triarylalkylborate salts are preferred initiators for infrared laser sensitive plate. Titanocene compounds and hexaarylbiimidazole compounds are preferred initiators for visible or ultraviolet laser sensitive plate, and hexaarylbiimidazole compounds are more preferred. The initiator is added in the photosensitive layer preferably at 0.1 to 40% by weight of the photosensitive layer, more preferably 1 to 30%, and most preferably 5 to 20%.

Infrared sensitizing dyes useful in the thermosensitive layer of this invention include any infrared absorbing dye effectively absorbing an infrared radiation having a wavelength of 750 to 1200 nm. It is preferable that the dye has an absorption maximum between the wavelengths of 780 and 1100 nm. Various infrared absorbing dyes are described in U.S. Pat. Nos. 5,858,604, 5,922,502, 6,022,668, 5,705,309, 6,017,677, and 5,677,106, and in the book entitled "Infrared Absorbing Dyes" edited by Masaru Matsuoka, Plenum Press, New York (1990), and can be used in the thermosensitive layer of this invention. Examples of useful infrared absorbing dyes include squarylium, croconate, cyanine (including polymethine), phthalocyanine (including naphthalocyanine), merocyanine, chalcogenopyryloarylidene, oxyindolizine, quinoid, indolizine, pyrylium and metal dithiolene dyes. Cyanine and phthalocyanine dyes are preferred infrared absorbing dyes. The infrared laser sensitizing dye is added in the photosensitive layer preferably at 0.1 to 20% by weight of the photosensitive layer, more preferably 0.5 to 10%, and most preferably 1 to 5%.

Visible or ultraviolet sensitizing dyes useful in the visible or ultraviolet sensitive photosensitive layer of this invention include any dyes having a wavelength maximum of from 200 to 600 nm. Suitable visible or ultraviolet sensitive dyes include, for example, cyanine dyes; rhodamine compounds such as rhodamine 6G perchloride; chromanone compounds such as 4-diethylaminobenzilidene chromanone; dialkylaminobenzene compounds such as ethyl 4-dimethylaminobenzoate and dialkylaminobenzene; dialkylaminobenzophenone compounds such as 4,4'-bis(dimethylamino)benzophenone, 4,4'-bis(diethylamino)benzophenone, 2-(p-dimethylaminophenyl)benzooxazole, 2-(p-diethylaminophenyl)benzooxazole, 2-(p-dimethylaminophenyl)benzo[4,5]benzooxazole, 2-(p-dimethylaminophenyl)benzo[6,7]benzooxazole, 2,5-bis(p-diethylaminophenyl)1,3,4-oxazole, 2-(p-dimethylaminophenyl)benzothiazole, 2-(p-diethylaminophenyl)benzothiazole, 2-(p-dimethylaminophenyl)benzimidazole, 2-(p-diethylaminophenyl)benzimidazole, 2,5-bis(p-diethylaminophenyl) 1,3,4-thiadiazole, (p-dimethylaminophenyl)pyridine, (p-diethylaminophenyl) pyridine, 2-(p-dimethylaminophenyl)quinoline, 2-(p-diethylaminophenyl)quinoline, 2-(p-dimethylaminophenyl)pyrimidine or 2-(p-diethylaminophenyl)pyrimidine; unsaturated cyclopentanone compounds such as 2,5-bis{[4-(diethylamino)phenyl]methylene}-(2E,5E)-(9Cl)-cyclopentanone and bis(methylindolenyl)cyclopentanone; coumarin compounds such as 3-benzoyl-7-methoxy coumarin and 7-methoxy coumarin; and thioxanthene compounds such as 2-isopropylthioxanthenone. Dialkylaminobenzene compounds and bis(dialkylamino)benzophenone compounds are particularly suitable for ultraviolet laser sensitive plate. Bis(dialkylamino)benzophenone compounds are particularly suitable for violet laser sensitive plate. The sensitizing dyes as described in U.S. Pat. Nos. 5,422,204 and 6,689,537, and U.S. Pat. App. Pub. No. 2003/0186165 can be used for the photosensitive layer of this invention. The visible or ultraviolet laser sensitizing dye is added in the photosensitive layer preferably at 0.1 to 20% by weight of the photosensitive layer, more preferably 0.5 to 15%, and most preferably 1 to 10%.

The free radical polymerizable photosensitive composition of the present invention can contain one or more hydrogen donors as polymerization accelerator. Examples of the hydrogen donors include compounds having a mercapto group (also called mercapto compounds) such as 2-mercaptobenzoxazole, 2-mercaptobenzothiazole, 2-mercaptobenzimidazole and 3-mercapto-1,2,4-triazole; and N-aryl-α-amino acids, their salts and esters such as N-phenylglycine, salts of N-phenylglycine, and alkyl esters of N-phenylglycine such as N-phenylglycine ethyl ester and N-phenylglycine benzyl ester. Preferred hydrogen donors are 2-mercaptobenzoxazole, 2-mercaptobenzothiazole, 2-mercaptobenzimidazole, 3-mercapto-1,2,4-triazole, N-phenylglycine, N-phenylglycine ethyl ester, and N-phenylglycine benzyl ester. Combination of at least one mercapto compound and at least one N-aryl-α-amino acid or its ester or salt can be advantageously used in the photosensitive layer to increase the photospeed. The hydrogen donor is preferably added in the photosensitive layer at 0.01 to 15% by weight of the photosensitive layer, more preferably 0.1 to 10%, and most preferably 0.5 to 5%.

Various surfactants can be added into the photosensitive layer to, for example, enhance the developability or coatability. Both polymeric and small molecule surfactants can be used. However, it is preferred that the surfactant has low or no volatility so that it will not evaporate from the photosensitive layer of the plate during storage and handling. Nonionic surfactants are preferred. Preferred nonionic surfactants are polymers and oligomers containing one or more polyether (such as polyethylene glycol, polypropylene glycol, and copolymer of ethylene glycol and propylene glycol) segments. Examples of preferred nonionic surfactants are block copolymers of propylene glycol and ethylene glycol (also called block copolymer of propylene oxide and ethylene oxide); ethoxylated or propoxylated acrylate oligomers; and polyethoxylated alkylphenols and polyethoxylated fatty alcohols. The nonionic surfactant is preferably added at from 0.1 to 30% by weight of the photosensitive layer, more preferably from 0.5 to 20%, and most preferably from 1 to 15%.

Micro particles may be added into the photosensitive layer to enhance, for example, the developability and non-tackiness of the plate. Suitable micro particles include polymer particles, talc, titanium dioxide, barium sulfate, silicone oxide, and aluminum micro particles, with an average particle size of less than 10 microns, preferably less than 5 microns, more preferably less than 2 microns, and most preferably less than 1 microns.

For plates with rough and/or porous substrate surface, a thin water-soluble interlayer may be deposited between the substrate and the photosensitive layer. Preferably, the substrate surface is rough and/or porous enough and the interlayer is thin enough to allow bonding between the photosensitive layer and the substrate through mechanical interlocking. Such a plate configuration is described in U.S. Pat. No. 6,014,929, the entire disclosure of which is hereby incorporated by reference. Preferred releasable interlayer comprises a water-soluble polymer. Polyvinyl alcohol (including various water-soluble derivatives of polyvinyl alcohol) is a preferred water-soluble polymer. Usually pure water-soluble polymer is coated. However, one or more surfactant and other additives may be added. The water-soluble polymer is generally coated from an aqueous solution with water as the only solvent. A water-soluble organic solvent, preferably an alcohol such as ethanol or isopropanol, can be added into the water-soluble polymer aqueous coating solution to improve the coatability. The alcohol is preferably added at less than 40% by weight of the solution, more preferably at less than 20%, and most preferably at less than 10%. The releasable interlayer preferably has an average coverage of 1 to 200 mg/m$^2$, more preferably 2 to 100 mg/m$^2$, and most preferably 4 to 40 mg/m$^2$. The substrate preferably has an average surface roughness Ra of 0.2 to 2.0 microns, and more preferably 0.4 to 1.0 microns.

The photosensitive layer may be conformally coated onto a roughened substrate (for example, with Ra of larger than 0.4 microns) at thin coverage (for example, of less than 1.2 g/m$^2$) so that the plate can have microscopic peaks and valleys on the photosensitive layer coated surface and exhibit low tackiness and good block resistance, as described in U.S. Pat. No. 6,242,156, the entire disclosure of which is hereby incorporated by reference.

A water soluble or dispersible overcoat can be coated on the photosensitive layer to, for example, improve the photospeed, surface durability, and/or developability of the plate. The overcoat preferably comprises a water-soluble polymer, such as polyvinyl alcohol (including various water-soluble derivatives of polyvinyl alcohol). Combination of two or more water-soluble polymers (such as a combination of polyvinyl alcohol and polyvinylpyrrolidone) may also be used. Polyvinyl alcohol is a preferred water-soluble polymer. Various additives, such as surfactant, wetting agent, defoamer, leveling agent and dispersing agent, can be added into the overcoat formulation to facilitate, for example, the coating or development process. Examples of surfactants useful in the overcoat of this invention include polyethylene glycol, polypropylene glycol, and copolymer of ethylene glycol and propylene glycol, polysiloxane surfactants, perfluorocarbon surfactants, alkylphenyl ethylene oxide condensate, sodium dioctylsulfosuccinate, sodium dodecylbenzenesulfonate, and ammonium laurylsulfate. Various organic or inorganic micro particles (such as micro particles of a polymer, talc, titanium dioxide, barium sulfate, silicone oxide, and aluminum) may be added into the overcoat to, for example, reduce the tackiness or moisture sensitivity of the plate. The overcoat preferably has a coverage of from 0.001 to 4.0 g/m$^2$, more preferably from 0.01 to 2.0 g/m$^2$, and most preferably from 0.1 to 1.0 g/m$^2$.

In a preferred embodiment for the thermosensitive lithographic printing plate of this invention, the thermosensitive layer comprises a polymeric binder, a polymerizable ethylenically unsaturated monomer having at least one terminal ethylenic group, a free-radical initiator, and an infrared absorbing dye. Other additives such as surfactant, dye or pigment, exposure-indicating dye (such as leuco crystal violet, leucomalachite green, azobenzene, 4-phenylazodiphenylamine, and methylene blue dyes), and free-radical stabilizer (such as methoxyhydroquinone) may be added. The weight ratio of all the monomers to all the polymeric binders is preferably at least 1.0, more preferably at least 1.5, and most preferably at least 2.0.

In another preferred embodiment for the thermosensitive lithographic printing plates of this invention, the thermosensitive layer comprises a polymeric binder, a urethane (meth) acrylate monomer having at least 4 (meth)acrylate groups, a free-radical initiator, and an infrared absorbing dye.

In yet another preferred embodiment for the thermosensitive lithographic printing plates of this invention, the thermosensitive layer comprises a polymeric binder having polymer backbone with recurring units having pendant poly (alkylene glycol) side chains, a (meth)acrylate monomer having at least one (meth)acrylate group, a free-radical initiator, and an infrared absorbing dye.

In further another preferred embodiment for the thermosensitive lithographic printing plates of this invention, the thermosensitive layer comprises a polymeric binder which is a graft polymer having at least one graft chain containing a hydrophilic segment containing at least one monomer unit selected from the group consisting of an amido group-containing monomer, an acid group-containing monomer, a quaternary ammonium salt-containing monomer and a hydroxyl group-containing monomer, a (meth)acrylate monomer having at least one (meth)acrylate group, a free-radical initiator, and an infrared absorbing dye.

In yet further another preferred embodiment for the thermosensitive lithographic printing plates of this invention, the thermosensitive layer comprises a particulate polymer and an infrared absorbing dye or pigment (preferably infrared absorbing dye); said thermosensitive layer is capable of hardening through coalescence of the polymer particles upon exposure to an infrared laser. A nonionic surfactant or a water-soluble polymer is preferably added in the thermosensitive layer.

In a preferred embodiment for visible light sensitive lithographic printing plates of this invention, the photosensitive layer comprises a polymeric binder, a polymerizable ethylenically unsaturated monomer having at least one terminal ethylenic group, a free-radical initiator, and a visible sensitizing dye. A hydrogen donor is preferably added to increase the photospeed. Other additives such as surfactant, dye or pigment, exposure-indicating dye, and free-radical stabilizer may be added. The weight ratio of all the monomers to all the polymeric binders is preferably at least 1.0, more preferably at least 1.5, and most preferably at least 2.0.

In a preferred embodiment for violet or ultraviolet light sensitive lithographic printing plates of this invention, the photosensitive layer comprises a polymeric binder, a polymerizable ethylenically unsaturated monomer having at least one terminal ethylenic group, a free-radical initiator, and a violet or ultraviolet sensitizing dye. A hydrogen donor is preferably added to increase the photospeed. Other additives such as surfactant, dye or pigment, exposure-indicating dye, and free-radical stabilizer may be added. The weight ratio of all the monomers to all the polymeric binders is preferably at least 1.0, more preferably at least 1.5, and most preferably at least 2.0.

In another preferred embodiment for the violet or ultraviolet laser sensitive lithographic plates of this invention, the photosensitive layer comprises a polymeric binder, a monomer having at least 3 (meth)acrylate group, a hexaarylbiimidazole or titanocene compound, a dialkylaminobenzophenone compound, and a hydrogen donor. The weight ratio of all the monomers to all the polymeric binders is preferably at least 1.0, more preferably from 1.5 to 6.0, and most preferably from 2.0 to 5.0. A hexaarylbiimidazole compound is preferred among hexaarylbiimidazole and titanocene compounds. A preferred dialkylaminobenzophenone compound is a 4,4'-bis(dialkylamino)benzophenone compound.

In yet another preferred embodiment for the violet or ultraviolet laser sensitive lithographic plates of this invention, the photosensitive layer comprises a polymeric binder, a urethane monomer having at least 4 (meth)acrylate group, a hexaarylbiimidazole or titanocene compound, a dialkylaminobenzophenone compound, and a hydrogen donor. The weight ratio of all the monomers to all the polymeric binders is preferably at least 0.5, more preferably from 1.0 to 6.0, and most preferably from 2.0 to 5.0. A hexaarylbiimidazole compound is preferred among hexaarylbiimidazole and titanocene compounds. A preferred dialkylaminobenzophenone compound is a 4,4'-bis(dialkylamino)benzophenone compound. A non-urethane (meth)acrylate monomer can be added.

In further another preferred embodiment for the violet or ultraviolet laser sensitive lithographic plates of this invention, the photosensitive layer comprises a polymeric binder, a urethane monomer having at least 4 (meth)acrylate group, a non-urethane monomer having at least 4 (meth)acrylate groups, a hexaarylbiimidazole or titanocene compound, a dialkylaminobenzophenone compound, and a hydrogen donor. The weight ratio of the urethane (meth)acrylate monomer to the non-urethane (meth)acrylate monomer is preferably from 0.10 to 10.0, more preferably from 0.20 to 5.0, and most preferably from 0.30 to 3.0. The weight ratio of all the monomers to all the polymeric binders is preferably at least 0.5, more preferably from 1.0 to 6.0, even more preferably from 1.5 to 5.0, and most preferably from 2.0 to 4.0. A hexaarylbiimidazole compound is preferred among hexaarylbiimidazole and titanocene compounds. A preferred dialkylaminobenzophenone compound is a 4,4'-bis(dialkylamino) benzophenone compound.

In yet further another preferred embodiment for the violet or ultraviolet laser sensitive lithographic plates of this invention, the photosensitive layer comprises a polymeric binder having polymer backbone with recurring units having pendant poly(alkylene glycol) side chains, a (meth)acrylate monomer having at least one (meth)acrylate group, a free-radical initiator, and a violet or ultraviolet sensitizing dye. A hydrogen donor is preferably added. Other additives such as surfactant, dye or pigment, exposure-indicating dye, and free-radical stabilizer may be added.

For preparing lithographic plates capable of discoloration with a deactivating solution which is also capable of causing discoloration, the above plates preferably further comprise a dye, a dispersed pigment, or a latent dye in the photosensitive layer.

The lithographic plates as described in U.S. Pat. Nos. 6,482,571, 6,576,401, 5,548,222, and 6,541,183, and U.S. patent application Ser. Nos. 10/720,882, 11/075,663, 11/175,518, 11/266,817, 11/356,911, 11/728,648, 1/787,878, 11/800,634, 11/810,710, 11/825,571, 11/859,756, and 11/944,204, the entire disclosures of which are hereby incorporated by reference, can be used for the instant invention.

This invention is further illustrated by the following examples of its practice.

Examples 1-4

An electrochemically grained, anodized and polyvinylphosphonic acid treated aluminum substrate was coated with a thermosensitive layer formulation PS-1 with a #6 Meyer rod, followed by drying in an oven at 100° C. for 2 min.

| PS-1 | |
| --- | --- |
| Component | Weight (g) |
| Neocryl B-728 (Polymer from Zeneca) | 2.50 |
| Ebecryl 220 (Acrylate monomer from UCB Chemicals) | 5.99 |

-continued

| PS-1 | |
| --- | --- |
| Component | Weight (g) |
| Pluronic L43 (Nonionic surfactant from BASF) | 0.40 |
| (4-(2-Hydroxytetradecyl-oxy)phenyl)phenyliodonium hexafluorophosphate | 1.00 |
| PINA KF-1151 (Infrared absorbing polymethine dye from Allied Signal) | 0.10 |
| 2-Butanone | 90.00 |

The thermosensitive layer coated plate was further coated with a water-soluble overcoat OC-1 using a #6 Meyer rod, followed by hot air blow drying and baking in an oven at 100° C. for 2 min.

| OC-1 | |
| --- | --- |
| Component | Weight (g) |
| Airvol 203 (polyvinyl alcohol from Air Products) | 4.84 |
| Silwet 7604 (Surfactant from Union Carbide) | 0.02 |
| Triton X-100 (Surfactant from www.chemistrystore.com) | 0.14 |
| Water | 95.00 |

The coated plate was exposed with an infrared laser imager equipped with laser diodes emitting at about 830 nm (Trendsetter from Creo) at a dosage of about 200 mJ/cm$^2$. The exposed areas of the plate showed brown color, with the non-exposed areas remaining light green. The exposed plate was cut into several pieces for further tests.

The first piece was dipped in a 0.2% by weight sodium hydroxide aqueous solution for 20 seconds followed by hot air blow to dry off excess water. The second piece was dipped in a 0.2% by weight sodium hydroxide aqueous solution for 20 seconds followed by hot air blow to dry off excess water and then exposed with a 1000 watts ultraviolet light for 1 minute on an ultraviolet light exposure device (INSTANT 2 VACUUM PRINTER 24×28, from Berkey Technical Co., New York). The third piece was rinsed with water. The fourth piece was not treated. The treatments were performed under yellow light. All the above plate pieces were then exposed to an office white fluorescent light (total of 80 watts at about 2 meters) for 2 hours. The appearances of the plate pieces were listed in Table 1.

Each of the treated plates was tested on a wet lithographic press AB Dick 360 (under office white fluorescent light). The plate was directly mounted on the plate cylinder of the press. After starting the press, the fountain roller was engaged for 20 rotations, the ink roller (carrying emulsion of ink and fountain solution) was applied to the plate cylinder for 20 rotations, and the plate cylinder was then engaged with the blanket cylinder and printed with paper for 200 impressions. The printed sheets were evaluated for on-press developability of the plate, with the results summarized in Table 1.

TABLE 1

| Treatment method | Appearance after laser exposure and treatment | | Performance on AB Dick 360 lithographic press | | |
|---|---|---|---|---|---|
| | Laser non-exposed areas | Laser exposed areas | Background at 20 impressions | Background at 200 impressions | Inking in imaging areas |
| 0.2% Sodium hydroxide | Light green | Light brown | Clean | Clean | Good |
| 0.2% Sodium hydroxide + Overall UV exposure | Colorless | Dark brown | Clean | Clean | Good |
| Rinse with water | Light green | Brown | Toning | Toning | Good |
| No treatment | Light green | Brown | Inked | Inked | Good |

Examples 5-10

An electrochemically grained and anodized aluminum sheet was first coated with the photosensitive layer formulation PS-2 with a #6 Meyer rod, followed by drying in an oven at 110° C. for 1 min.

| PS-2 | |
|---|---|
| Component | Weight (g) |
| Carboset 527 (Alkaline soluble polymeric binder from B. F. Goodrich) | 1.93 |
| Ebecryl 220 (Acrylate monomer from UCB Chemicals) | 5.43 |
| Renol Blue B2G-HW (Blue pigment dispersed in polyvinylbutyral from Clariant) | 0.42 |
| Pluronic L43 (Nonionic surfactant from BASF) | 0.53 |
| 2,2-Bis(2-chlorophenyl)-4,4',5,5'-tetraphenyl-1,1'-biimidazole | 1.09 |
| 4,4'-Bis(diethylamino)benzophenone | 0.49 |
| 2-Mercaptobenzoxazole | 0.12 |
| Acetone | 27.00 |
| 2-Methoxypropanol | 63.00 |

The photosensitive layer coated plate was further coated with a water-soluble overcoat OC-2 using a #6 Meyer rod, followed by hot air blow drying and baking in an oven at 110° C. for 1 min. All the coatings were performed under a red light and the plate was then stored in a light tight box.

| OC-2 | |
|---|---|
| Component | Weight ratios |
| Airvol 203 (Polyvinyl alcohol from Air Products) | 15.0 |
| Triton X-100 (Surfactant from Union Carbide) | 0.20 |
| Water | 85.0 |

The plate was exposed with a violet plate imager equipped with a 60 mw violet laser diode emitting at about 405 nm (MAKO-8 from ECRM) for a dosage of about 65 μJ/cm$^2$. The plate was imaged in an orange light room (with Fuji Yellow FV30 lights from Encapsulite), and was kept in a light tight box before and after imaging. The laser exposed plate was cut into 6 pieces for further tests. Unless specified, the following tests were performed under red light before the plates were developed.

The first piece was dipped in an alkaline aqueous solution containing 2% by weight of sodium silicate and 3% by weight of Triton X-100 (nonionic surfactant from ChemistryStore-.com) in a tray and then immediately overall exposed with an ultraviolet light on an exposure device (INSTANT 2 VACUUM PRINTER 24×28, from Berkey Technical Co., New York) for 20 seconds, with the plate immersed in the same solution during the exposure. The overall exposed plate was then developed by wiping with a cloth for 4 times in the same solution to remove the non-hardened areas, followed by water rinse. The plate was fully developed, showing clean background, good imaging pattern, and a highlight resolution of 0.5%.

The second piece was dipped in an alkaline aqueous solution containing 2% by weight of sodium silicate and 3% by weight of Triton X-100 in a tray and then immediately taken out of the solution to overall expose with an ultraviolet light on an exposure device (INSTANT 2 VACUUM PRINTER 24×28) for 20 seconds, with the plate remaining wetted with the solution (but without being immersed in the solution) during the exposure. The overall exposed plate was then developed by wiping with a cloth for 4 times in the same solution in the tray to remove the non-hardened areas, followed by water rinse. The plate was fully developed, showing clean background, good imaging pattern, and a highlight resolution of 1%.

The third piece was poured over with an alkaline aqueous solution containing 2% by weight of sodium silicate and 3% by weight of Triton X-100 in an amount just enough to cover roughly all the coated surface of the plate, and then immediately overall exposed with an ultraviolet light on an exposure device (INSTANT 2 VACUUM PRINTER 24×28) for 20 seconds. The overall exposed plate was then developed by wiping with a cloth for 4 times in the same alkaline aqueous solution in a tray to remove the non-hardened areas, followed by water rinse. The plate was fully developed, showing clean background, good imaging pattern, and a highlight resolution of 1%.

The fourth piece was dipped in an alkaline aqueous solution containing 2% by weight of sodium silicate and 3% by weight of Triton X-100 in a tray for 20 seconds. The plate (without overall ultraviolet exposure) was then developed by wiping with a cloth for 4 times in the same solution in the tray to remove the non-hardened areas followed by water rinse. The plate was fully developed, showing clean background, good imaging pattern, and a highlight resolution of 2%.

The fifth piece was dipped in water in a tray and then immediately overall exposed with an ultraviolet light on an exposure device (INSTANT 2 VACUUM PRINTER 24×28) for 20 seconds, with the plate immersed in water in the tray during the exposure. The overall exposed plate was then developed by wiping with a cloth for 4 times in an alkaline aqueous solution containing 2% by weight of sodium silicate and 3% by weight of Triton X-100 in the tray, followed by water rinse. The plate failed to develop, with the photosensitive coating remaining on the whole plate.

The sixth piece, without any pre-treatment, was exposed to room white light for 2 minutes and then developed by wiping with a cloth for 4 times in an alkaline aqueous solution containing 2% by weight of sodium silicate and 3% by weight of Triton X-100 in a tray, followed by water rinse. The plate failed to develop, with the photosensitive coating remaining on the whole plate.

Examples 11-14

An electrochemically grained, anodized, and polyvinyl phosphonic acid treated aluminum sheet was coated with a photosensitive layer formulation PS-3 with a #6 Meyer rod, followed by drying in an oven at 100° C. for 2 min.

PS-3

| Component | Weight ratios |
|---|---|
| Carboset 527 (Alkaline soluble polymeric binder from B. F. Goodrich) | 2.35 |
| DPHA (Acrylic monomer from UCB Chemicals) | 6.61 |
| Pluronic L43 (Nonionic surfactant from BASF) | 0.53 |
| 2',2,4,4',5,5'-Hexa[multichloro-substituted phenyl]-1,1'-bi-1-H-imidazole | 1.49 |
| 4,4'-Bis(dimethylamino)benzophenone | 0.53 |
| 2-Mercaptobenzoxazole | 0.14 |
| Crystal violet | 0.34 |
| 2-Butanone | 88.00 |

The photosensitive layer coated plate was further coated with a water-soluble overcoat OC-1 using a #6 Meyer rod, followed by drying in an oven at 100° C. for 2 min. All the coatings were performed under a red light and the plate was then stored in a light tight box.

The plate was exposed with a violet plate imager equipped with a 60 mw violet laser diode emitting at about 405 nm (MAKO-8 from ECRM) for a dosage of about 90 µJ/cm$^2$. The plate was imaged in an orange light room (with Fuji Yellow FV30 lights from Encapsulite), and was kept in a light tight box before and after imaging.

The laser imaged plate was cut into 5 pieces for further tests. The first piece was dipped in a 1% sodium silicate aqueous solution and then immediately overall exposed with an ultraviolet light on an exposure device (INSTANT 2 VACUUM PRINTER 24×28, from Berkey Technical Co., New York) for 10 seconds. The second piece was dipped in a 1% sodium silicate aqueous solution and then immediately overall exposed with an infrared light (from a 250 watts infrared lamp by General Electric) at a distance of about 5 inches for 10 seconds. The third piece was dipped in a 1% sodium silicate aqueous solution without further overall exposure (other than to the room light) for 10 seconds. The above plate pieces were under red light before and during treatment with the alkaline aqueous solution. The fourth piece was not treated. The plates treated with 1% sodium silicate aqueous solution showed good printout with light blue non-imaged areas and purple imaged areas, while the plate without treatment showed essentially no printout with the whole coated side showing the original purple color.

Each of the treated plates was tested on a wet lithographic press (AB Dick 360) under office white light. The plate was directly mounted on the plate cylinder of the press. After starting the press, the fountain roller was engaged for 20 rotations, the ink roller (carrying emulsion of ink and fountain solution) was applied to the plate cylinder for 20 rotations, and the plate cylinder was then engaged with the blanket cylinder and printed with paper for 200 impressions. The printed sheets were evaluated for on-press developability of the plate, with the results summarized in Table 2.

TABLE 2

| Treatment of the plate | Printout right before on-press development | Background at 20 impressions | Highlight resolution | Inking in imaging areas |
|---|---|---|---|---|
| 1% silicate followed by ultraviolet exposure | Good | Clean | 1% | Good |
| 1% silicate followed by infrared exposure | Good | Clean | 2% | Good |
| 1% silicate without exposure (other than room light) | Good | Clean | 4% | Good |
| No treatment | No | Inked | Not developed | Good |

I claim:

1. A method of processing a lithographic printing plate, comprising in order:
    (a) providing a lithographic plate comprising (i) a hydrophilic substrate, and (ii) an oleophilic photosensitive layer capable of hardening upon exposure to a laser having a wavelength selected from 200 to 1200 nm;
    (b) imagewise exposing said plate with said laser to cause hardening of said photosensitive layer in the exposed areas, so as to form hardened areas in the exposed areas and non-hardened areas in the non-exposed areas;
    (c) contacting said plate with an aqueous developer on a developing processor, without developing said plate; wherein said developer is also capable of deactivating said photosensitive layer in the non-hardened areas;
    (d) while said plate is in contact with said developer, overall exposing said plate with said radiation from a radiation source equipped on said processor, without causing hardening of said non-hardened areas of the photosensitive layer; and
    (e) rubbing said plate while in contact with said developer to remove the non-hardened areas of said photosensitive layer.

2. The method of claim 1 wherein said plate is rubbed with at least one brush or roller while said plate is in contact with said deactivating solution during said development.

3. The method of claim 1 wherein said plate is dipped through said developer in a developer tank of said processor for both said deactivation and development, said tank having a brush or roller which rubs the plate when passing through the developer in the tank.

4. The method of claim 1 wherein said plate is overall exposed with said radiation both before and after said plate is rubbed while in contact with said developer.

5. A method of processing a lithographic printing plate, comprising in order:
    (a) providing a lithographic plate comprising (i) a hydrophilic substrate, and (ii) an oleophilic photosensitive layer that is removable with ink and/or fountain solution and capable of hardening upon exposure to a laser having a wavelength selected from 200 to 1200 nm;
    (b) imagewise exposing said plate with said laser to cause hardening of said photosensitive layer in the exposed areas, so as to form hardened areas in the exposed areas and non-hardened areas in the non-exposed areas;

(c) contacting said plate with a deactivating solution on a treating device to make the non-hardened areas of the photosensitive layer incapable of hardening upon exposure to said radiation, without developing said plate;

(d) overall exposing said plate with said radiation from a radiation source equipped on said treating device to cause at least one chemical or physical change to the photosensitive layer or the substrate, without causing hardening of said non-hardened areas of the photosensitive layer; and (e) developing said plate with ink and/or fountain solution on a lithographic press to remove the non-hardened areas of said photosensitive layer.

6. The method of claim 5 wherein said overall exposure causes further hardening of the photosensitive layer in the hardened areas.

7. The method of claim 5 wherein said treating solution is also capable of changing the color of the photosensitive layer primarily or only in the non-hardened areas, and said overall exposure further enhances the color contrast between the hardened areas and the non-hardened areas.

* * * * *